United States Patent
Liou et al.

(10) Patent No.: US 9,753,373 B2
(45) Date of Patent: Sep. 5, 2017

(54) LITHOGRAPHY SYSTEM AND SEMICONDUCTOR PROCESSING PROCESS

(71) Applicant: UNITED MICROELECTRONICS CORP., Hsin-Chu City (TW)

(72) Inventors: En-Chiuan Liou, Tainan (TW); Chia-Hung Wang, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/940,108

(22) Filed: Nov. 12, 2015

(65) Prior Publication Data

US 2017/0139329 A1    May 18, 2017

(51) Int. Cl.
  G03B 27/42    (2006.01)
  G03F 7/20     (2006.01)
  G01B 11/27    (2006.01)

(52) U.S. Cl.
  CPC ........ G03F 7/70141 (2013.01); G01B 11/272 (2013.01); G03F 7/70633 (2013.01)

(58) Field of Classification Search
  CPC ............ G03F 7/70633; G03F 7/70683; G03F 7/70625; G03F 7/70616; G03F 9/7003; G03F 1/42; G03F 9/7088; G03F 1/44; G03F 1/84; G03F 7/70141; G03F 9/7019; H01L 2223/54426
  See application file for complete search history.

(56) References Cited

U.S. PATENT DOCUMENTS

| 5,438,413 | A  | 8/1995 | Mazor |
| 6,947,141 | B2 | 9/2005 | Bischoff |
| 8,203,223 | B2 | 6/2012 | Marokkey |
| 8,250,497 | B2 | 8/2012 | Hsu |
| 2013/0253681 | A1 | 9/2013 | Hsieh |
| 2015/0140693 | A1* | 5/2015 | Chung ............... H01L 22/12 438/14 |

OTHER PUBLICATIONS

F. Bornebroek, Overlay Performance in advanced processes, Feb. 27, 2000.

\* cited by examiner

Primary Examiner — Mesfin Asfaw
(74) Attorney, Agent, or Firm — Winston Hsu

(57) ABSTRACT

A semiconductor processing method is provided and includes the following steps. A first semiconductor process is performed for a wafer to obtain plural overlay datum (x, y), wherein x and y are respectively shift values in X-direction and Y-direction. Next, A re-correct process is performed by a computer, wherein the re-correct process comprises: (a) providing an overlay tolerance value (A, B) and an original out of specification value (OOS %), wherein A and B are respectively predetermined tolerance values in X-direction and Y-direction; (b) providing at least a k value (kx, ky); (c) modifying the overlay datum (x, y) according to the k value (kx, ky) to obtain at least a revised overlay datum (x', y'); and (d) calculating a process parameter from the revised overlay datum (x', y'). Lastly, a second semiconductor process is performed according to the process parameter . . . . The present invention further provides a lithography system.

16 Claims, 5 Drawing Sheets

LITHOGRAPHY SYSTEM AND SEMICONDUCTOR PROCESSING PROCESS

BACKGROUND OF THE INVENTION

1. Field of the Invention

The present invention is related to a lithography system and a semiconductor processing process, and more particularly, to a lithography system and a semiconductor processing process, containing performing at least one re-correct process.

2. Description of the Prior Art

With decreasing feature sizes and shrinking line widths of integrated circuits, lithography has become critical for semiconductor manufacture. As the tolerance of line width error is increasingly small, lithography machines have been upgraded from step-and-repeat systems (steppers) to advanced step-and-scan systems (scanners). To enhance the resolution and alignment accuracy in lithography, it is necessary to control the overlay errors of lithography to within a tolerance.

A semiconductor process refers to a process used to create a large number of semiconductor devices on a wafer using a multiple-step sequence of photolithographic and chemical processing steps. In such a highly-laminating process, when one of laminated layers is misaligned, the subsequent layers may thus be affected and further misaligned, thereby leading to failure of electrical connections among semiconductor devices and the layers, function losses, or short circuits. Therefore, precise and stable overlay control is a relatively important factor for process management to ensure yield of the semiconductor devices and efficiency of production.

For example, a conventional step-and-repeat aligner (i.e., a stepper or scanner) usually has an alignment sensor for detecting alignment marks that are disposed at specific locations of a wafer before a lithography exposure process, and an alignment offset of the aligner may be calculated according to the detected misalignment/alignment. If a subsequent rework process is required for the wafer, the overlay offset may be used to calibrate the aligner for ensuring optimal alignment between patterns of a current patterning layer (or an upper layer) and a previous patterning layer (or a lower layer).

SUMMARY OF THE INVENTION

To provide a better exposing process, a semiconductor processing process and a lithography system are provided.

According to one embodiment, a semiconductor processing process includes the following steps. A first semiconductor process is performed for a wafer to obtain plural overlay datum (x, y), wherein x and y are respectively shift values in X-direction and Y-direction. Next, A re-correct process is performed by a computer, wherein the re-correct process comprises: (a) providing an overlay tolerance value (A, B) and an original out of specification value (OOS %), wherein A and B are respectively predetermined tolerance values in X-direction and Y-direction; (b) providing at least a k value (kx, ky); (c) modifying the overlay datum (x, y) according to the k value (kx, ky) to obtain at least a revised overlay datum (x', y'); and (d) calculating a process parameter from the revised overlay datum (x', y'). Lastly, a second semiconductor process is performed according to the process parameter.

According to another embodiment, a lithography system is provided. The lithography system includes an alignment module, a processor and an exposing module. The alignment module is designed to perform an aligning process to obtain a plural overlay datum (x, y) on a wafer, wherein x and y are respectively shift values in X-direction and Y-direction. The processor designed to perform a re-correct process, comprising: (a) providing an overlay tolerance value (A, B), wherein A and B are respectively predetermined tolerance values in the X-direction and the Y-direction; (b) providing at least a k value ($k_x$, $k_y$); (c) modifying the overlay datum (x, y) according to the k value ($k_x$, $k_y$) to obtain at least a revised overlay datum (x', y'); and (d) calculating an exposure parameter from the revised overlay datum (x', y'). The exposing module designed to perform an exposing process to a resist layer according to the exposure parameter.

According to the lithography system and the semiconductor processing process shown above, the present invention is featured by providing a plurality of re-correct processes with different k values to decide a minimum out of specification (OOS %). The subsequent lithography process can be improved based on the decided OOS %. Since the tolerance value (A, B) is defined as different value, the overlay compensation can be operated asymmetrically for x-coordinate and y-coordinate, respectively.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
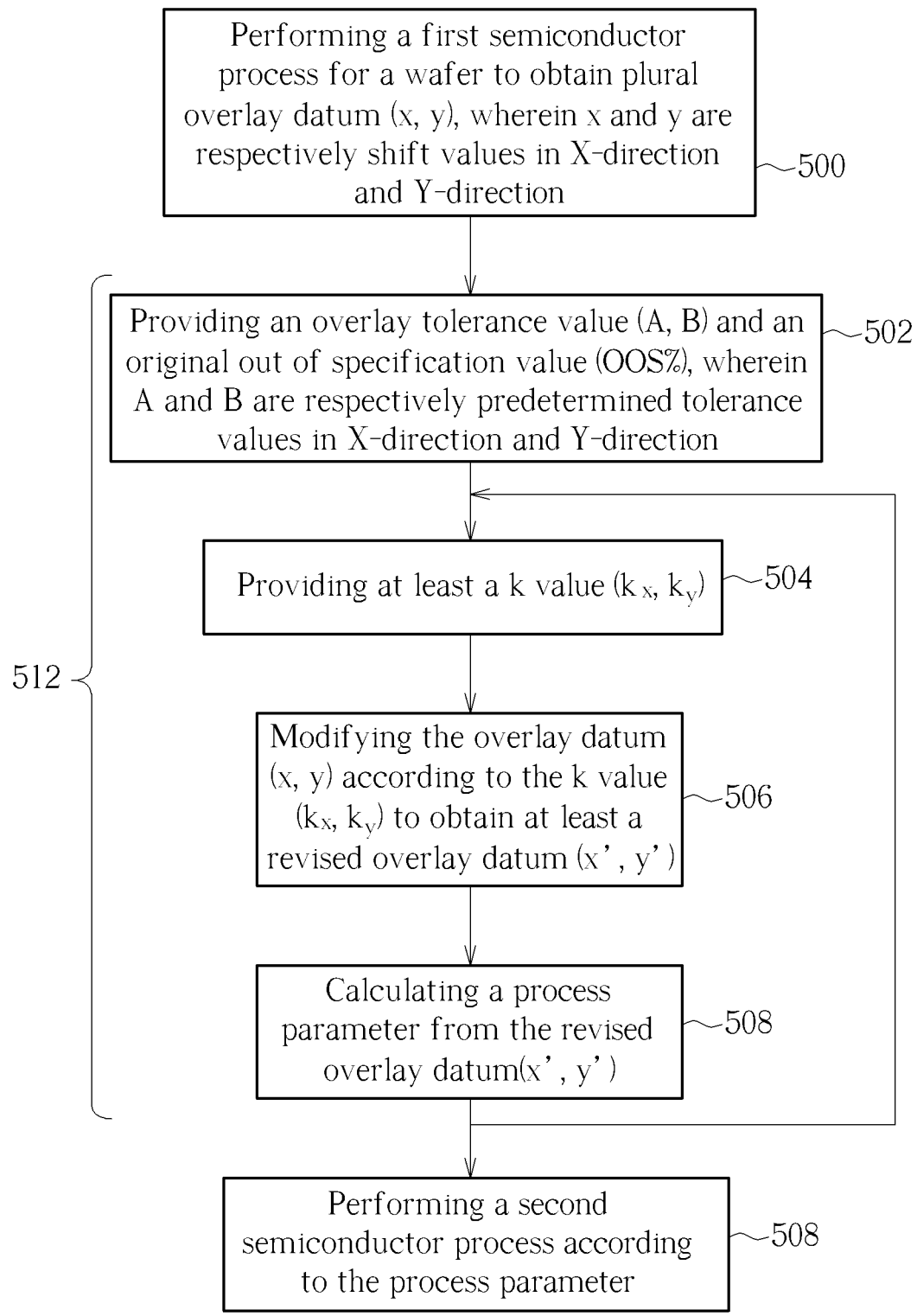
FIG. 1 shows a flow chart of the rework process according to one embodiment of the present invention.

Please refer to FIG. 1, which shows a flow chart of the semiconductor processing method according to one embodiment of the present invention. As shown in FIG. 1, the method set forth in the present invention includes the following steps:

Step 500: performing a first semiconductor process for a wafer to obtain plural overlay datum (x, y), wherein x and y are respectively shift values in X-direction and Y-direction;

Step 502: providing an overlay tolerance value (A, B) and an original out of specification value (OOS %), wherein A and B are respectively predetermined tolerance values in X-direction and Y-direction;

Step 504: providing at least a k value ($k_x$, $k_y$);

Step 506: modifying the overlay datum (x, y) according to the k value ($k_x$, $k_y$) to obtain at least a revised overlay datum (x', y');

Step 508: calculating a process parameter from the revised overlay datum (x', y');

Step 510: performing a second semiconductor process according to the process parameter.

Figure 2:
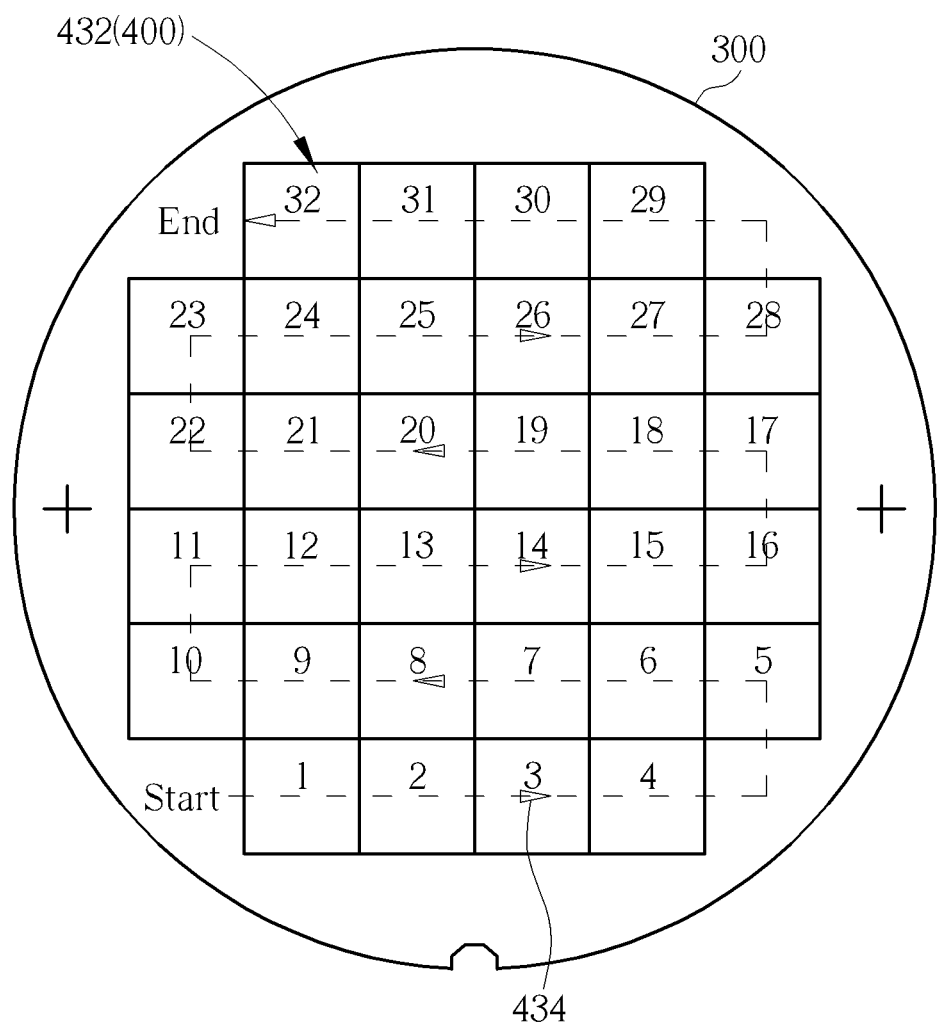
FIG. 2 to FIG. 6 shows schematic diagrams of semiconductor processing process according to one embodiment of the present invention.

For the detail description, please refer to FIG. 2 to FIG. 6, which shows schematic diagrams of the semiconductor processing process according to one embodiment of the present invention. First, a first semiconductor process to obtain plural overlay datum (x, y) (step 500). Please see FIG. 2 for reference. In this embodiment, the first semiconductor process is a lithography process. The lithography process in the present invention can be performed by any lithography system, such as a scanning-projection aligner, a step-and-repeat aligner or a step-and-scan system, and is not limited thereto. Preferably, the lithography process is performed by using a step-and-scan system, wherein each reticle pattern is aligned and exposed at multiple locations as the aligner steps across the wafer, in order to transfer a pattern of a reticle (or a mask) onto the photoresist layer. As shown in FIG. 2 for example, the aligner (not shown) steps along a direction 434 along plural regions 400, from the region 401 to the region 432, to perform the lithography process. Thus, the reticle pattern is transferred to a photoresist layer (not shown) in each of the region 400. In one embodiment, the region 400 may be comprised of one die region or a plurality of die regions, depending on the design of the lithography system.

Since the aligner should step toward different regions 400, there may be some overlay between each region 400. Next, the overlay datum (x, y) are analyzed. An inspection process, such an after-development-inspection (ADI) or after-etching-inspection (AEI) or the combinations, is performed to collect a plurality of overlay datum from each region 400. The overlay datum may be obtained from misalignment between alignment marks on the current patterning layer and the previous patterning layers (e.g., the layers patterned before the current layer) of the semiconductor substrate, or from comparison between measured coordinates of the alignment marks and predetermined coordinates with respect to the substrate. It is understood that the overlay datum can also be obtained by other process or other machine that is associated with misalignment among the current patterning layer and the previous patterning layers.

Figure 3:
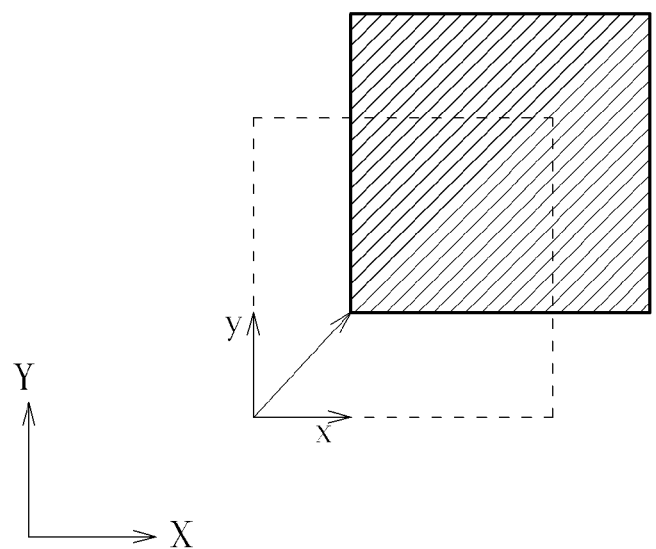
Figure 4:
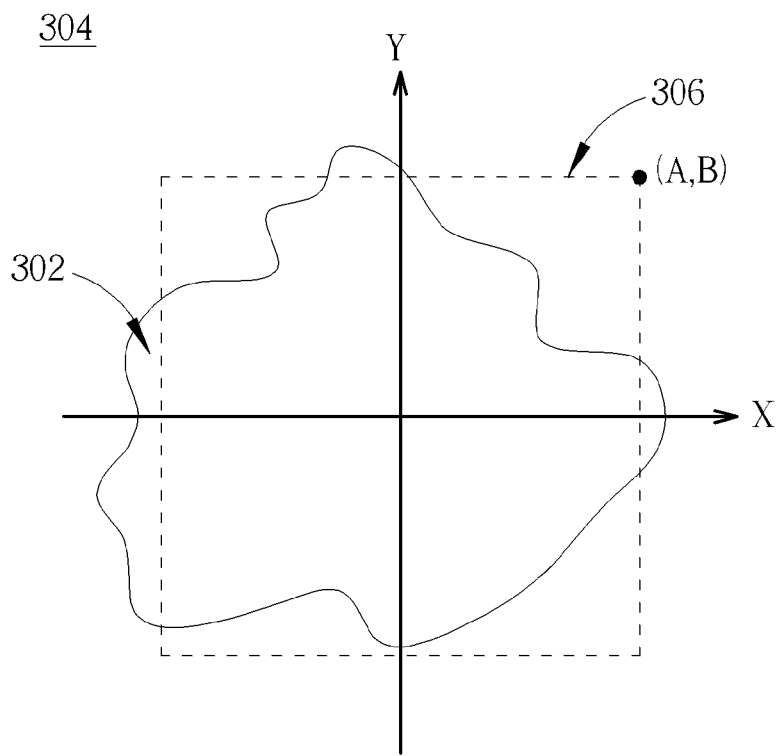

Regarding to the overlay datum, as shown in FIG. 3 for example, each overlay data (x, y) in the preset embodiment includes an x value representing a shift value in the X-direction and a y value representing a shift in the Y-axis. It should be noted that the overlay data may be stored as a form of polar coordinates (r, θ) or Cartesian coordinates (x, y), in which the two coordinates can be converted by one skilled in the art. In this embodiment, the overlay data is exemplified using the Cartesian coordinates, but the present invention should not be limited in this respect. In one embodiment, after collecting the plural overlay datum (x, y), an overlay map is illustrated based on the overlay datum. As shown in FIG. 4, the overlay map is formed by illustrating each overlay data (x, y) on a Cartesian coordinates and thus forming an overlay data area 302 thereon. The overlay data area 302 can be regarded as an assembling area of all the overly datum.

Next, providing an overlay tolerance value (A, B) and an original out of specification value (OOS %), wherein A and B are respectively predetermined tolerance values in X-direction and Y-direction (step 502). The predetermined tolerance values may be spec values (i.e., values specified in a device specification) or acceptable tolerances/margins of the lithography process and/or the lithography system. In one preferred embodiment, A is not equal to B. As shown in FIG. 4, a tolerance area 306 based on the overlay tolerance value (A, B) can also illustrated on the overlay map 304. The out of specification value (OOS %) reflects the aligning accuracy of the lithography process. The less the OOS % is, the more aligning accuracy it indicates. In one preferred embodiment of the present invention, the rework process is aimed at obtaining a minimum out of specification value (OOS %).

Next, at least a k value ($k_x$, $k_y$) is provided (step 504). ($k_x$, and $k_y$) are corresponding to overlay datum (x, y), respectively. In the present invention, ($k_x$, $k_y$) value can be any value, preferably a rational number. In one embodiment, $k_x$ is not equal to $k_y$.

Next, the overlay datum (x, y) is modified according to the k value ($k_x$, $k_y$) to obtain at least a revised overlay datum (x', y') (step 506). The conversion between the tolerance value (A, B) and the revised tolerance (A', B') based on the ($k_x$, $k_y$) value can be calculated by elementary arithmetic operations, linear functional operations, polynomial operations or combinations thereof, to thereby obtain the corresponding converted data (A', B'). For example, the tolerance value (A, B) is divided by k value to obtain the revised tolerance value ($A'=A/k_x$, $B'=B/k_y$).

Thereafter, the overlay datum (x, y) is re-corrected by a rule considering the revised tolerance value (A', B'), thereby obtaining a revised overlay datum (x', y'). In one embodiment, the rule is:

if |x|<A', then x'=0; or if |y|<B', then y'=0.

Figure 5:
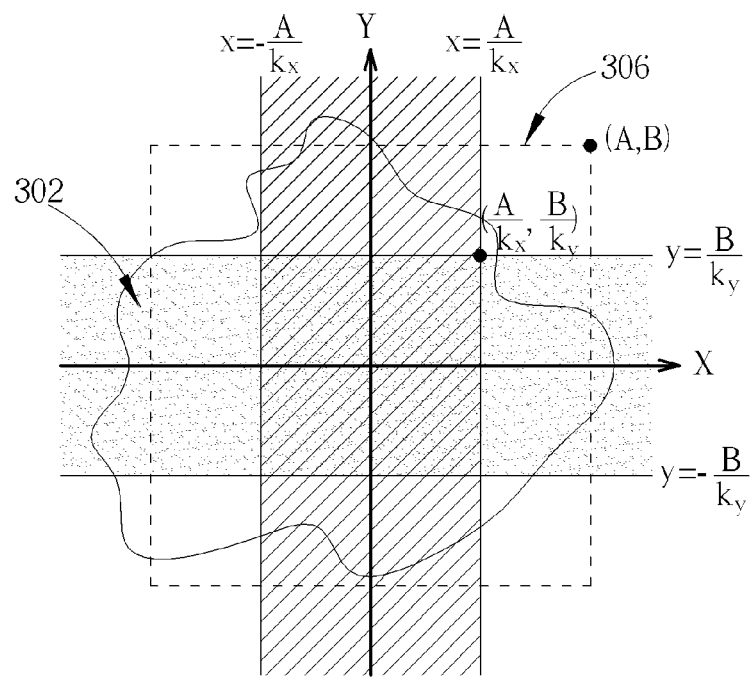

For instance, as shown in FIG. 5, a shaded region between $x=A/k_x$ and $x=-A/k_x$ is provided, wherein the x coordinate value of the overlay data in the shaded region is converted to 0. On the other hand, a dot region between $y=B/k_y$ and $y=-B/k_y$ is provided, wherein the y coordinate value of the overlay data in the dot region is converted to 0.

Figure 6:
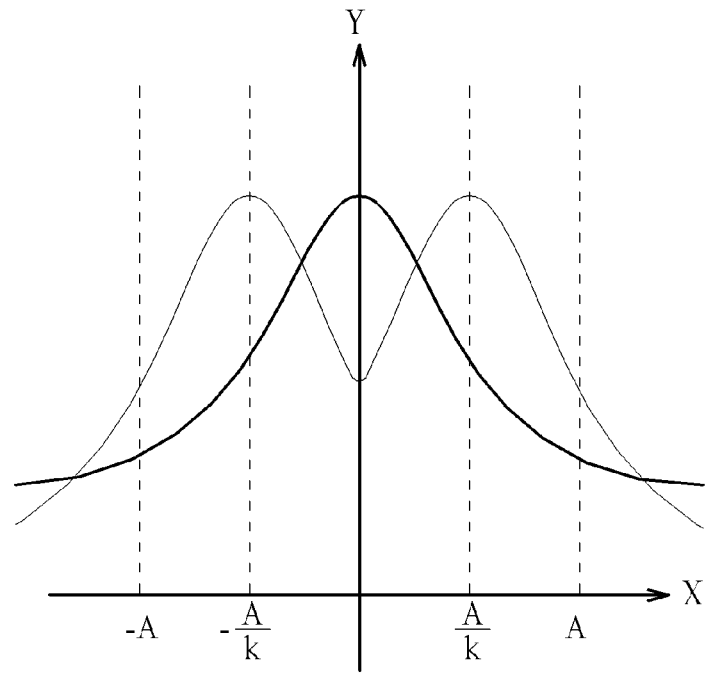

Please see FIG. 6, which shows a schematic diagram representing x-coordinate value of the overlay data and the revised overlay data. As depicted, after the re-correct process, since the region between ($-A/k_x$, $A/k_y$) is changed to zero, the distribution of the overlay value is changed from the original distribution (thin line) to a normal distribution (thicker line). Thus, the revised overlay values along the x coordinate are therefore optimized because some of which have been compensated and set to zero.

After comparing each revised OOS % from different k value, a minimum OOS % is chosen and the corresponding k value is stored in the storing unit. An overlay re-correct unit of a lithography system can be provided to store the result and calculate corresponding result to obtain a revised parameter for the lithography process (step 506). The revised parameter can be any factors that can affect the result of the lithography process. In one embodiment, the revised parameters include adjusting the aligning process and/or the aligning machine of the lithography process and/or the lithography machine.

In the following step, another wafer is subjected to the lithography system by using the revised parameter (step 508). Thus, a better result of the lithography process, such as a lower OOS %, is therefore obtained. In one embodiment, the first semiconductor process (step 500) and the second semiconductor process (step 508) may be performed upon the same wafer. For example, after forming a photoresist layer on the wafer and carry out the first lithography process, the overlay datum can be obtained. After performing the above-mentioned re-correct processes, a revised parameter is obtained. If the OOS % of the first lithography process is too high, the operator can decide to remove the patterned photoresist layer from the wafer. Next, another new photoresist layer is coated onto the same wafer, which is then subjected to a second semiconductor processing, such as an exposing or a lithography process with a revised parameter.

In another embodiment, the first semiconductor process is an aligning process and the overlay datum (x, y) is obtained by observing plural aligning marks on the wafer, and the second semiconductor process is an exposing process for the same wafer.

Figure 7:
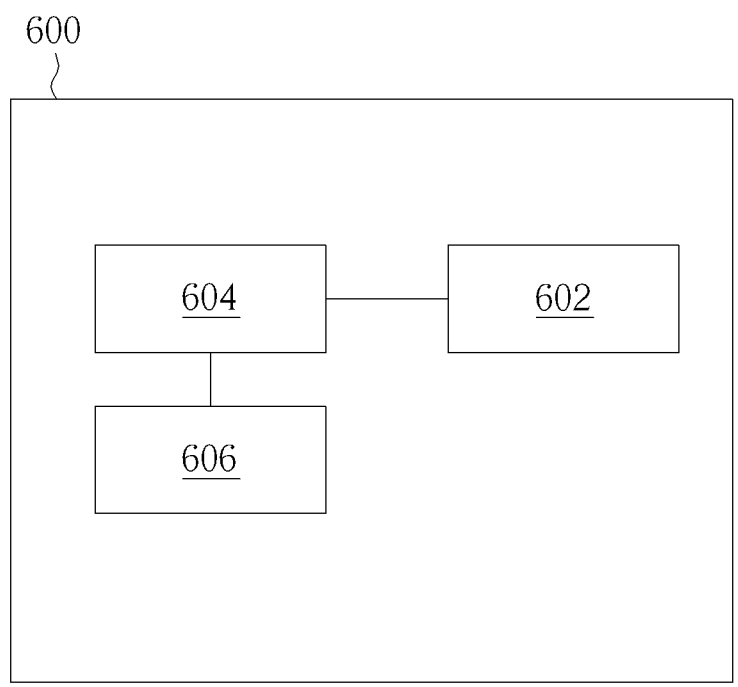
FIG. 7 shows a schematic diagram of a lithography system according to one embodiment of the present invention.

Please refer to FIG. 7, which shows a schematic diagram of a lithography system according to one embodiment of the present invention. As shown in FIG. 7, the lithography system 600 includes an aligning module 602, an exposing module 604 and an overlay re-correct system 606. The exposing module 604 is designed to expose a resist layer coated on a wafer, such as the wafer 300 in FIG. 2. The aligning module 602 is designed to alter the alignment during exposing, such as performing an aligning process to obtain a plural overlay datum (x, y) on a wafer.

In one embodiment, the overlay re-correct system 606 includes an overlay data collector (not shown), a data storing unit (not shown) and a re-correct unit (not shown). The overlay-correct system 606 can be a processor in an ordinary addressing/positioning equipment, a misalignment measuring machine (e.g., a stepper, a scanner, etc.), or a storage device included in a misalignment measuring machine that is capable of receiving and storing raw overlay data (x, y). The overlay data collector is designed to obtain an overlay datum on a substrate of the wafer. In detail, the overlay datum collector can receive plural sets of overlay data from a substrate via, for example, direct scanning measurement or calculation. The overlay data may be obtained from misalignment between alignment marks on the current patterning layer and the previous patterning layers (e.g., the layers patterned before the current layer) of the semiconductor substrate, or from comparison between measured coordinates of the alignment marks and predetermined coordinates with respect to the substrate. The data storing unit is designed to store the overlay data, for example, from the overlay data collector. Each overlay data can be in a form of polar coordinates (r, θ) or Cartesian coordinates (x, y), in which the two coordinates can be converted by one skilled in the art. The re-correct unit refers a calculator configured to perform a plurality of re-correct processes on multiple sets of the overlay data that are stored in the data storing unit. Each re-correct process includes:

(a) providing a k value;
(b) modifying a tolerance value of the lithography process and/or machine to obtain a revised tolerance according to the k value;
(c) modifying the overlay datum to obtain a revised overlay datum according to a rule considering the revised tolerance;
(d) calculating an out of specification value (OOS %) based on the revised overlay datum by considering parameters of the exposing unit.

In one embodiment the re-correct unit can further compare each OOS % and deciding the minimum OOS %. In one embodiment, the set of revised overlay datum with minimum OOS % can be converted to a revised parameter and output to the exposing tool, so as to optimize the exposing tool. Preferably, the revised parameter is relative to the aligning unit.

In summary, the present invention provides a lithography system and a semiconductor processing method. The semiconductor processing method can be a rework processing for obtaining a better processing result, such as a less out of specification (OOS %). In one preferred embodiment, it is featured that a plurality of re-correct processes with different k values is performed thereto decide a minimum out of specification (OOS %). The subsequent lithography process can be improved based on the decided OOS %. Since the tolerance value (A, B) is defined as different value, the overlay compensation can be operated asymmetrically for x-coordinate and y-coordinate, respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor processing method, comprising:
performing a first semiconductor process for a wafer to obtain plural overlay datum (x, y), wherein x and y are respectively shift values in X-direction and Y-direction;
performing a re-correct process by a computer, comprising:
(a) providing an overlay tolerance value (A, B) and an original out of specification value (OOS %), wherein A and B are respectively predetermined tolerance values in X-direction and Y-direction;
(b) providing at least a k value ($k_x$, $k_y$);
(c) modifying the overlay datum (x, y) according to the k value ($k_x$, $k_y$) to obtain at least a revised overlay datum (x', y'); and
(d) calculating a process parameter from the revised overlay datum (x', y'); and
performing a second semiconductor process according to the process parameter, wherein each revised overlay datum (x', y') is obtained by considering a rule below:
if |x|<A', then x'=0; or
if |y|<B', then y'=0,
wherein A'=A/$k_x$ and B'=B/$k_x$.

2. The semiconductor processing method according to claim 1, wherein A is not equal to B.

3. The semiconductor processing methods according to claim 1, wherein $k_x$ is not equal to $k_y$.

4. The semiconductor processing method according to claim 1, in step (c),
wherein each revised overlay datum (x', y') is obtained by a rule considering a revised tolerance value (A', B'),
wherein the revised tolerance value (A', B') is obtained by modifying the tolerance value (A, B) according to the k value ($k_x$, $k_y$).

5. The semiconductor processing method according to claim 4, wherein different k values ($k_x$, $k_y$) are used to obtain different revised overlay dutum.

6. The semiconductor processing method according to claim 4, wherein each k value ($k_x$, $k_y$) has a linear equation relationship.

7. The semiconductor processing method according to claim 1, wherein the first semiconductor process is a lithography process and the overlay datum is obtained by observing a plural overlay marks on the wafer.

8. The semiconductor processing method according to claim 1, wherein the second semiconductor process is another lithography process for another wafer.

9. The semiconductor processing method according to claim 1, wherein the second semiconductor process is an exposing process applying to said wafer in the first semiconductor process.

10. A lithography system, comprising:
an alignment module designed to perform an aligning process to obtain a plural overlay datum (x, y) on a wafer, wherein x and y are respectively shift values in X-direction and Y-direction;

a processor designed to perform a re-correct process, comprising:
  (a) providing an overlay tolerance value (A, B), wherein A and B are respectively predetermined tolerance values in the X-direction and the Y-direction;
  (b) providing at least a k value ($k_x$, $k_y$);
  (c) modifying the overlay datum (x, y) according to the k value ($k_x$, $k_y$) to obtain at least a revised overlay datum (x', y'); and
  (d) calculating an exposure parameter from the revised overlay datum (x', y'); and
an exposing module designed to perform an exposing process to a resist layer according to the exposure parameter, wherein each revised overlay datum (x', y') is obtained by considering a rule below:
  if |x|<A', then x'=0; or
  if |y|<B', then y'=0,
  wherein A'=A/$k_x$ and B'=B/$k_x$.

11. The lithography system according to claim 10, wherein A is not equal to B.

12. The lithography system according to claim 10, wherein $k_x$ is not equal to $k_y$.

13. The lithography system according to claim 10, in step (b),
  wherein each revised overlay datum (x', y') is obtained by a rule considering a revised tolerance value (A', B'),
  wherein the revised tolerance value (A', B') is obtained by modifying the tolerance value (A, B) according to the k value ($k_x$, $k_y$).

14. The lithography system according to claim 10, wherein different k values ($k_x$, $k_y$) are used to obtain different revised overlay dutum (x', y').

15. The lithography system according to claim 14, wherein each k value ($k_x$, $k_y$) has a linear equation relationship.

16. The lithography system according to claim 10, in step (c),
  the exposure parameter is decided by an optimized revised overlay datum having an optimized OOS % less than the original OOS %.

* * * * *